(12) United States Patent
Kottapalli et al.

(10) Patent No.: US 8,848,458 B2
(45) Date of Patent: Sep. 30, 2014

(54) FAST-BYPASS MEMORY CIRCUIT

(75) Inventors: Venkata Kottapalli, Fremont, CA (US); Scott Pitkethly, San Francisco, CA (US); Christian Klingner, Sunnyvale, CA (US); Matthew Gerlach, Plymouth, MI (US)

(73) Assignee: Nvidia Corporation, Santa Clara, CA (US)

( * ) Notice: Subject to any disclaimer, the term of this patent is extended or adjusted under 35 U.S.C. 154(b) by 326 days.

(21) Appl. No.: 13/327,693

(22) Filed: Dec. 15, 2011

(65) Prior Publication Data

US 2013/0155781 A1    Jun. 20, 2013

(51) Int. Cl.
*G11C 7/10*    (2006.01)

(52) U.S. Cl.
USPC ............ 365/189.05; 365/189.011; 365/154; 365/230.08

(58) Field of Classification Search
CPC ...................................... G11C 21/00
USPC ........ 365/49.11, 76, 77, 78, 189.011, 189.02, 365/189.05, 230.01, 230.08, 233.1
See application file for complete search history.

(56) References Cited

U.S. PATENT DOCUMENTS

| | | | | |
|---|---|---|---|---|
| 5,349,255 | A | * | 9/1994 | Patel ............................ 327/141 |
| 7,227,798 | B2 | * | 6/2007 | Gupta et al. .................. 365/205 |
| 2003/0123320 | A1 | * | 7/2003 | Wright et al. ................. 365/233 |

OTHER PUBLICATIONS

Bowman, et al., "Time-Borrowing Multi-Cycle On-Chip Interconnects for Delay Variation Tolerance", Circuit Research Lab, Intel Corporation, Hillsboro, OR, Copyright 2006, ISLPED Oct. 4-6, 2006, pp. 79-84.

* cited by examiner

*Primary Examiner* — Son Dinh
*Assistant Examiner* — Uyen B Tran (57) ABSTRACT

A memory circuit in which a level of a first data input appears promptly at an output in response to a clock pulse received. The circuit includes a flip-flop triggered by the clock pulse and configured to receive the first data input and drive a second data input. The circuit also includes a first control input driven by the clock pulse, a second control input driven by the flip-flop and selection logic configured to receive the first and second data inputs and the first and second control inputs. The selection logic is configured to drive the output of the memory circuit to the level of the first data input or of the second data input depending on the first and second control inputs.

20 Claims, 8 Drawing Sheets

FAST-BYPASS MEMORY CIRCUIT

TECHNICAL FIELD

This patent application relates to the field of integrated-circuit (IC) engineering, and more particularly, to high-speed digital microarchitecture.

BACKGROUND

Digital data may flow through an IC via numerous logic paths. Such paths may include sequential logic—clocks, one-shots, and memory circuits such as flip-flops. In some ICs, the overall throughput of data may be limited by the data-to-output lag ($t_{DQ}$) of a memory circuit, which is a function of the data-setup time ($t_S$) and the clock-to-output lag ($t_{CQ}$). It may be desirable, therefore, to reduce both the $t_S$ and the $t_{CQ}$ of memory circuits that limit data throughput.

Furthermore, sequential logic operating at very high clock speeds may be prone to the effects of clock skew, clock jitter, and within-die delay variations, which can cause logic errors. One way to avoid such errors is to reduce the clock speed, which also reduces data throughput. A better alternative may be to implement time borrowing. Time borrowing is useful for absorbing clock skew and clock jitter and for averaging out within-die delay variations. This approach can extend the useful range of clock speed in an IC. Time-borrowing concepts may not be applicable, however, to every type of memory circuit.

Accordingly, the disclosure herein provides a novel class of memory circuit which exhibits attractively short $t_S$ and $t_{CQ}$ characteristics and is amenable to time borrowing.

DETAILED DESCRIPTION

Aspects of this disclosure will now be described by example and with reference to the illustrated embodiments listed above. Components that may be substantially the same in one or more embodiments are identified coordinately and are described with minimal repetition. It will be noted, however, that elements identified coordinately may also differ to some degree. The claims appended to this description uniquely define the subject matter claimed herein. The claims are not limited to the example structures and numerical ranges set forth below, nor to implementations that address the herein-identified problems or disadvantages of the current state of the art.

Figure 1:
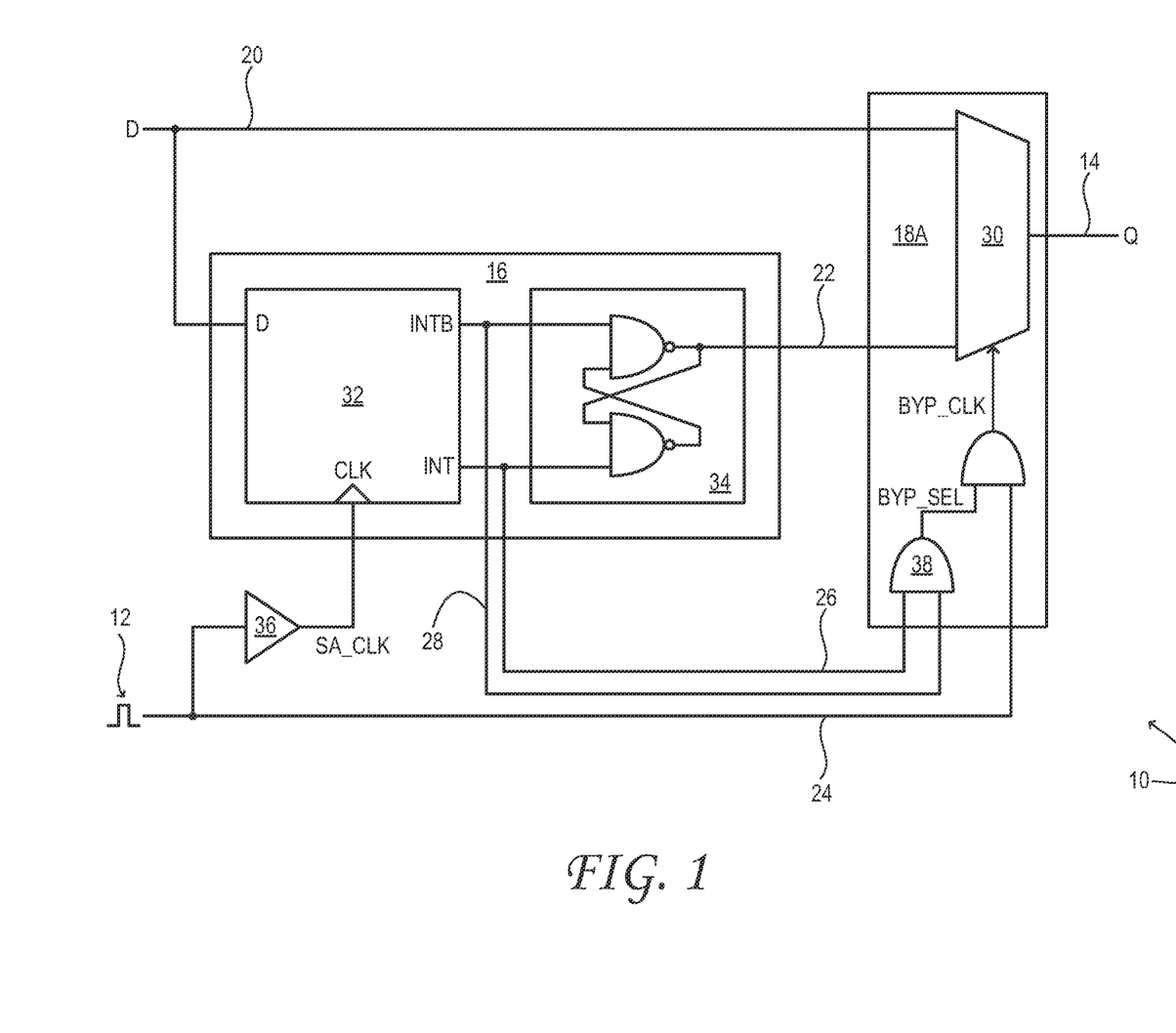
FIG. 1 schematically shows a non-transparent, fast-bypass memory circuit in accordance with an embodiment of this disclosure.

FIG. 1 schematically shows an example embodiment in the form of a non-transparent, fast-bypass memory circuit 10. In this embodiment, a rising edge of clock pulse 12 received in the memory circuit causes input data D to appear promptly at output 14. In some embodiments, the components of the memory circuit may be fabricated from complementary metal-oxide-semiconductor (CMOS) elements. In other embodiments, different semiconductor technologies may be used.

As described in further detail below, memory circuit 10 includes flip-flop 16, which is configured to store the input data D. In some data paths, $t_{CQ}$, the time required for input data to be stored in and propagate through the flip-flop may be undesirably great. Therefore, memory circuit 10 also includes selection logic 18A. The selection logic forces output 14 to the level of the stored data once the input data is stored—i.e., once the data is fully and stably latched in the flip-flop. Before the input data is stored, the selection logic, on receiving clock pulse 12, forces the output to the level of the unstored input data—20 in FIG. 1. In this manner, input data D takes a fast path to output 14, bypassing the logic stages within flip flop 16. Accordingly, the actual clock-to-output $t_{CQ}$ for the memory circuit may be significantly less than the time required for input data to be stored in and propagate through the flip flop.

In the embodiment of FIG. 1, selection logic 18A receives a plurality of data and control inputs: first data input 20, second data input 22, first control input 24, second control input 26, and third control input 28. Through multiplexer 30, the selection logic drives output 14 to a level of the first data input or of the second data input depending on the state of the first, second, and third control inputs. In the illustrated embodiment, the first control input is driven by clock pulse 12, while the second and third control inputs are driven by flip flop 16. It will be understood that the various data and control inputs or outputs described herein may also be referred to as 'input lines' and 'output lines' with no change in meaning.

Figure 2:
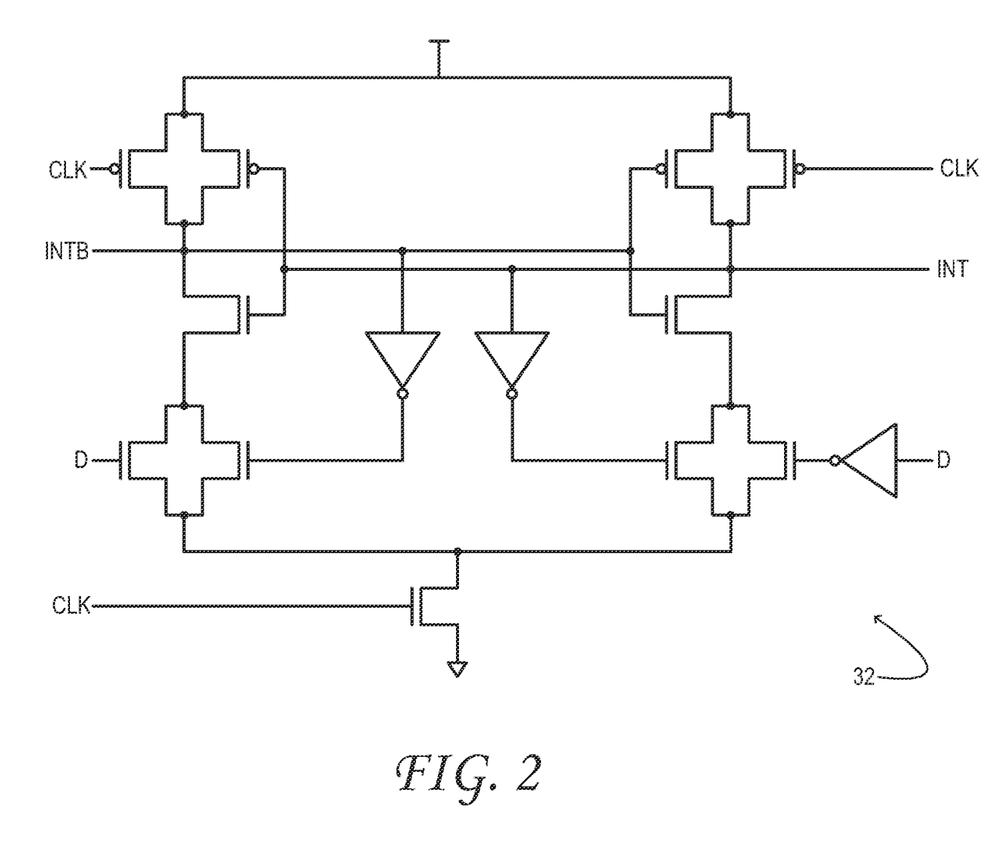
FIG. 2 schematically shows upstream memory logic of a memory circuit in accordance with an embodiment of this disclosure.

Continuing with the embodiment of FIG. 1, flip-flop 16 is a D-type flip flop, but other types—e.g., JK or T—are contemplated as well. Triggered by clock pulse 12, the flip-flop is configured to receive first data input 20 and to drive second data input 22, second control input 26, and third control input 28. To this end, the flip-flop includes upstream memory logic 32, which receives the first data input and drives the second and third control inputs. The upstream memory logic may include a clocked, sense-amplifier-type (SA) latch, as shown in FIG. 2. One benefit the SA latch offers is a very short $t_S$—0 picoseconds (ps) in some examples. It will be noted that the SA latch as a stand-alone memory circuit (in contrast to the configuration of FIG. 1) is typically not amenable to time borrowing.

Returning now to FIG. 1, flip-flop 16 also includes downstream memory logic 34 that receives second control input 26 and third control input 28 and drives second data input 22. In the illustrated embodiment, the downstream memory logic is an unclocked RS-type latch. It will be noted, however, that other suitable latches are contemplated as well.

In memory circuit 10, receipt of clock pulse 12 triggers flip-flop 16 to store the level of first data input 20. In general, such storing may be triggered by either edge of a clock pulse—i.e., a leading or trailing, rising or falling edge. For ease of description, it will be assumed hereinafter that flip-flop 16 is triggered to store the level of the first data input on receiving a leading edge of the clock pulse.

With selection logic 18A configured as illustrated, output 14 is driven to the level of first data input 20 only when each of the first, second, and third control inputs (24, 26, 28) are high, and is driven otherwise to the level of second data input 22. The second and third control inputs are maintained high prior to receipt of clock pulse 12—i.e., when the first control input is low. The BYP_SEL line is high under these conditions, but BYP_CLK is low. Accordingly, multiplexer 30 maintains the output at the level of the most recently stored input data (whichever state is present at second data input 22). When the clock pulse is initially received—i.e., when the first control input goes high—the second and third control inputs remain high momentarily, causing BYP_CLK to go high as well. As a result, multiplexer 30 switches the output to the level of the first data input. Thus, the output is driven to the level of the first data input before the level of the first data input is stored in flip-flop 16. More specifically, the output is driven to the level of the first data input on receipt of the clock pulse in selection logic 18A.

Figure 3:
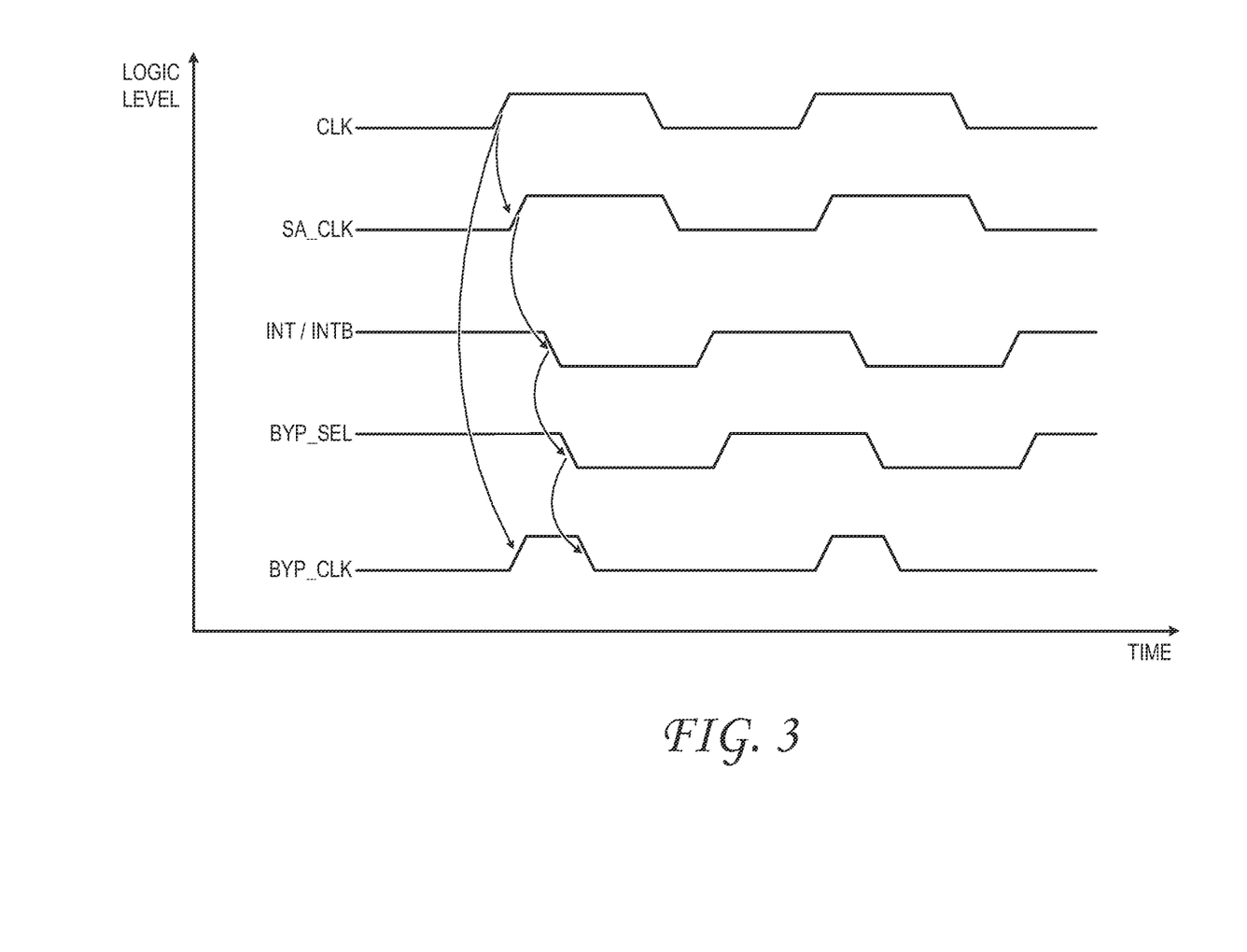
FIG. 3 is a qualitative timing chart showing the propagation of data through a memory circuit in accordance with an embodiment of this disclosure.

Propagating through buffer 36, the leading edge of clock pulse 12 triggers upstream memory logic 32 to store the level of first data input 20. This level then appears at second control input 26, while the complementary level appears at third control input 28. Accordingly, receipt of the clock pulse causes the second and third control inputs to be complements of each other, so that BYP_SEL and BYP_CLK are forced low. At this point, multiplexer 30 switches output 14 to the level of the stored data at second data input 22. In this manner, the output is driven to the level of the second data input as soon as the level of the first data input is stored in flip-flop 16. The timing chart of FIG. 3 shows in qualitative detail how the control signals are generated in memory circuit 10. The actual $t_{DQ}$ of this circuit, as well as the data-setup time $t_S$, is determined by the multiplexer delay. The overall $t_{DQ}$ in memory circuit 10 may be 30 ps or less, accordingly. In a traditional flip-flop, by contrast, $t_{DQ}$ would equal the sum of the propagation delays from two latch stages in series—60 to 80 ps, in some examples.

As noted above, flip-flop 16 is triggered by the leading edge of clock pulse 12 through buffer 36. The buffer causes the triggering of the flip-flop to be delayed relative to receipt of the clock pulse in the selection logic. The delay may be suitable in duration for softening the hard clock edge typically exhibited by an SA latch. Such softening enables time borrowing for clock skew and clock jitter absorption, and for averaging out within-die delay variations. In general, the amount of skew and jitter absorption may depend on the particulars of the clock-pulse distribution scheme. In one example, however, an absorption of 25 ps may be applied, effectively reducing $t_{DQ}$ from 30 ps to 5 ps. It will be noted, however, that the improvement to be gained in this strategy may not exceed the amount of creditable jitter in the clock tree, even if the transparency window of the memory circuit is larger.

Memory circuit 10 offers short $t_S$ and $t_{CQ}$, which combine to yield a short overall $t_{DQ}$. Furthermore, the circuit is amenable to time borrowing. The price paid for these benefits is a rather long data hold-time requirement $\tau_D$, which may be 70 ps in some examples. If the input data is changed after receipt of the clock pulse but before $\tau_D$, those changes will propagate directly through to the output, possibly causing a logic error. Accordingly, the disclosed memory circuit is most advantageous in throughput-limiting data paths where the input data is not susceptible to change within the $\tau_D$ interval.

No aspect of the foregoing description should be understood in a limiting sense, for numerous other embodiments are contemplated as well. The selection logic, for example, may be configured to receive only two control inputs—a first control input derived from the clock pulse and a second derived from the flip-flop. This adaptation could be accomplished trivially by incorporating AND gate 38 into flip-flop 16 instead of selection logic 18A. Other variants are contemplated in which the flip-flop is configured to drive single control line that reflects whether the input data has or has not been stored.

Figure 4:
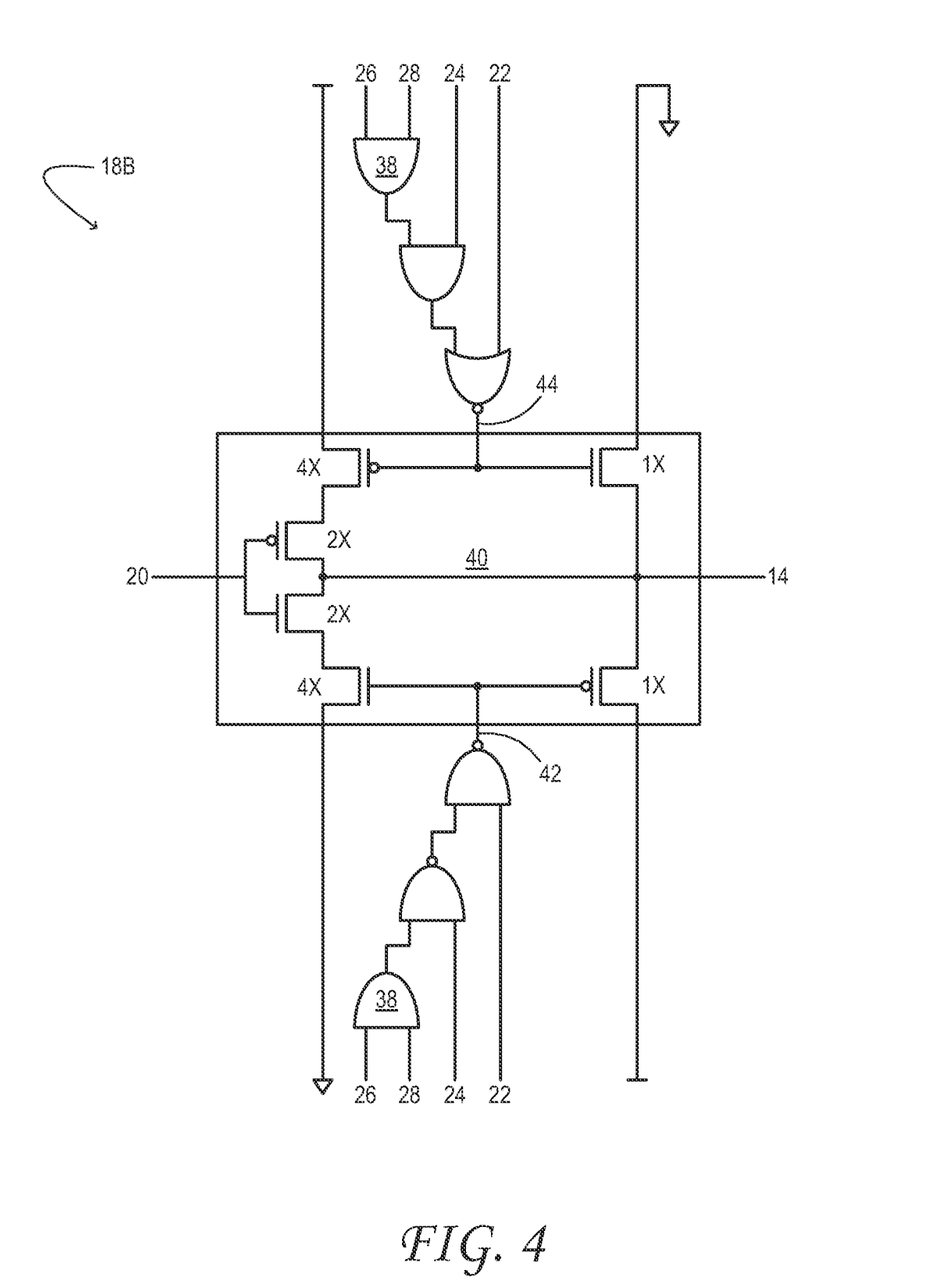
FIG. 4 schematically shows example selection logic of a memory circuit in accordance with an embodiment of this disclosure.

Furthermore, the selection logic need not include a multiplexer. Instead of the multiplexer, it may include an inverting complex gate, as shown in FIG. 4. In this embodiment, inverting complex gate 40 is configured to receive, in addition to first data input 20, an output-promoter input 42 and an output-demoter input 44, and to furnish output 14. Selection logic 18B is configured such that the output-demoter input becomes high only when second data input 22 and at least one of the first, second, and third control inputs (24, 26, 28) are low. The output-promoter input becomes high only when the second data input is low or each of the first, second, and third control inputs are high.

Thus, selection logic 18B is functionally analogous to selection logic 18A, but may offer an even shorter $t_{CQ}$ due to the decreased number of logic stages in the data-to-output path of inverting complex gate 40 relative to multiplexer 30.

In the embodiment shown in FIG. 4, inverting complex gate 40 is constructed from n- and p-channel metal-oxide-semiconductor field-effect transistors (MOSFETs) in a typical CMOS architecture. The designations 1×, 2×, and 4× indicate the relative width-to-length ratio or parallel redundancy of each MOSFET shown in the schematic, which directly relates to the ON conductance. In other words, the ON conductance of a 4× MOSFET is four times as great as that of a 1× MOSFET.

The speed advantage of inverting complex gate 40 is due largely to the fact that the signal from first data input 20 need only propagate through a single transistor stage before arriving at output 14. Despite the advantages of the illustrated embodiments, it will be understood that various other configurations, including other inverting complex-gate variants, are contemplated as well.

The configurations described above enable various methods to make a level of a first data input appear promptly at an output of a memory circuit in response to a clock pulse received. Accordingly, some such methods are now described, by way of example, with continued reference to the above configurations. It will be understood, however, that the methods here described, and others within the scope of this disclosure, may be enabled by different configurations as well. The methods may be entered upon any time the memory circuit is operating, and may be executed repeatedly. Further, some of the process steps described and/or illustrated herein may, in some embodiments, be omitted without departing from the scope of this disclosure. Likewise, the indicated sequence of the process steps may not always be required to achieve the intended results, but is provided for ease of illustration and description. One or more of the illustrated actions, functions, or operations may be performed repeatedly, depending on the particular strategy being used.

Figure 5:
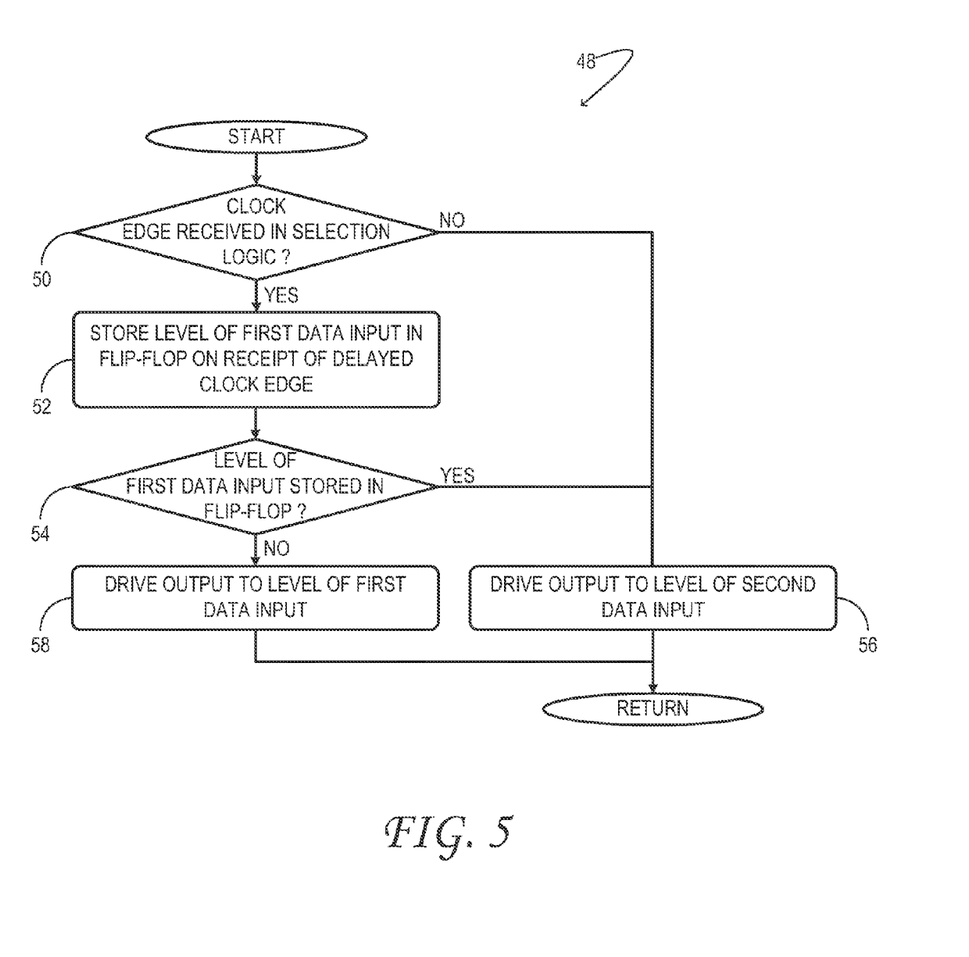
FIG. 5 illustrates an example method to make a level of a first data input appear promptly at an output of a memory circuit in response to a clock pulse received.

FIG. 5 illustrates an example method 48 to make a level of a first data input appear promptly at an output of a memory circuit in response to a clock pulse received.

At 50 of method 48 it is determined whether a pre-determined clock-pulse edge has been received in selection logic of the memory circuit. As described hereinabove, the clock pulse may in some embodiments drive a first control input of the memory circuit and thereby provide this information. If the clock-pulse edge has been received in the selection logic, then the method advances to 52. However, if the clock-pulse edge has not been received in the selection logic, then the method advances to 56.

At 52 the level of the first data input is stored in the flip-flop on receipt of the delayed clock-pulse edge. The clock-pulse edge may be delayed by a buffer stage arranged upstream of the clock input of the flip-flop, as described hereinabove. At 54 it is determined whether the level of the first data input has been stored in the flip-flop. As described herein, a second and/or third control input driven by the flip-flop may serve to indicate whether the level of the first data input has been or has yet to be stored. If the level of the first data input has been stored in the flip-flop, then the method advances to 56, or otherwise to 58. At 58 the output of the memory circuit is driven to the level of the first data input—i.e., the unlatched data. At 56 the output is driven to the level of the second data input—i.e., the latched data. From 58 or 56, method 48 returns.

Figure 6:
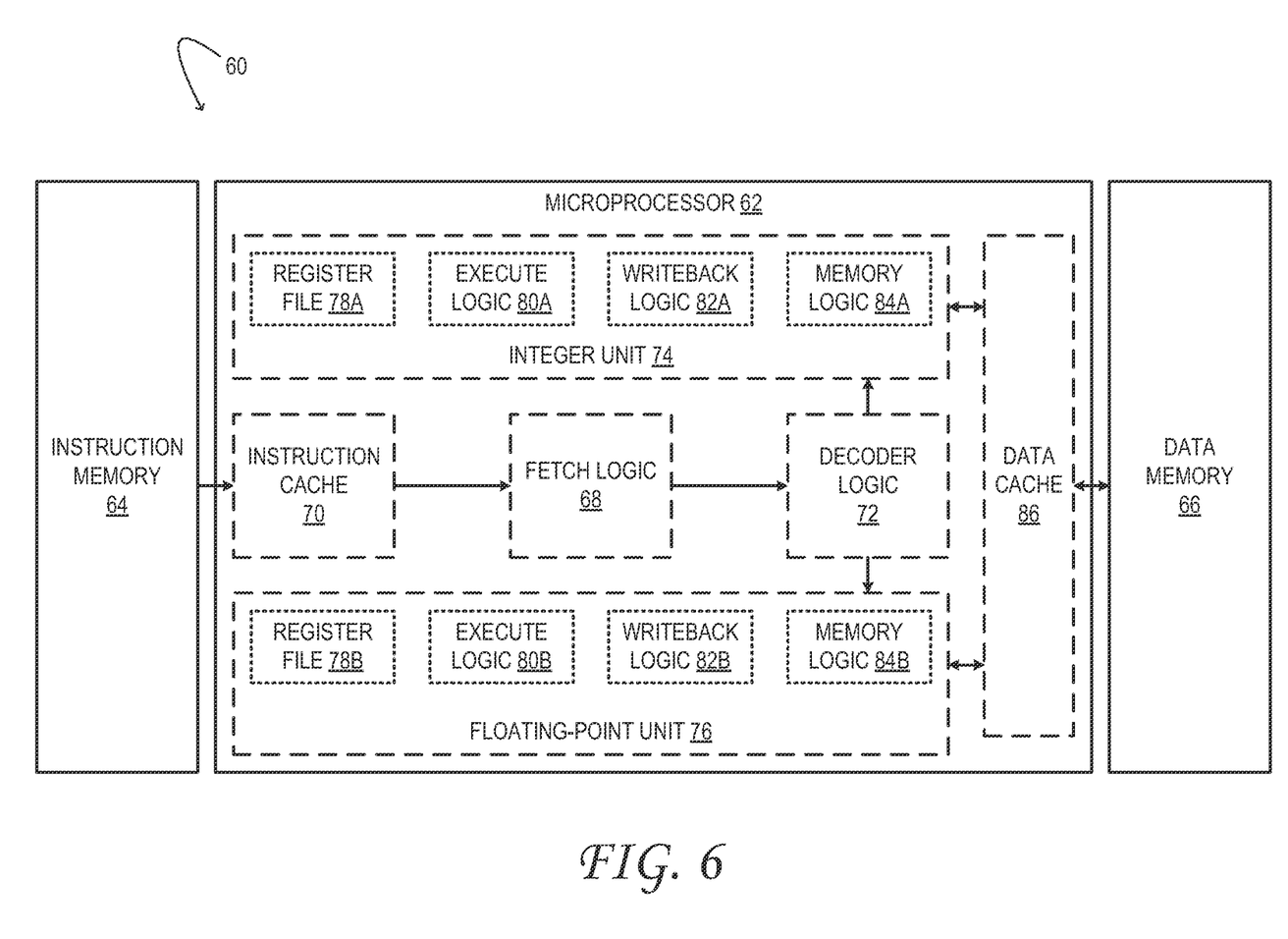
FIG. 6 schematically shows an example processing environment in accordance with an embodiment of this disclosure.

As noted above, the memory circuits described herein may be used to an advantage in logic paths where a very short $t_{DQ}$ is desired, and an acceptably long $\tau_D$ is available. Such paths exist in numerous, varied environments in IC microarchitecture. One example environment is illustrated in FIG. 6. This drawing schematically shows processing environment 60—a central processing unit or graphics processing unit of a personal computer, game system, or smartphone, for example. Environment 60 includes microprocessor 62 operatively coupled to instruction memory 64 and to data memory 66. Embodied in random-access memory of any suitable variant, the instruction and data memories may correspond to different physical memory structures or to different parts of the same physical memory structure.

Microprocessor 62 includes substructures 68 through 86, in addition to numerous control and interconnect structures not shown in FIG. 6. In particular, the microprocessor includes fetch logic 68 configured to read from instruction cache 70 a sequence of instructions stored in and retrieved from instruction memory 64. The fetch logic is further configured to dispatch the sequence of instructions to decoder logic 72. The decoder logic decodes the instructions by parsing op-codes, operands, and addressing modes, for example. Once parsed, the instructions are executed by integer unit 74 and/or floating-point unit 76.

In the embodiment shown in FIG. 6, integer unit 74 includes a register file 78A, execute logic 80A, write-back logic 82A, and memory logic 84A. Floating-point unit 76 includes a separate register file 78B and separate execute, write-back, and memory logic. In other embodiments, at least some of these structures may be shared between the integer and floating-point units. When the instructions are executed, a sequence of logical and/or arithmetic results evolve in the execute logic of one or both units. The corresponding write-back logic stores such results in an appropriate register of the corresponding register file. In some architectures, the memory logic has the exclusive task of enacting store and load operations to and from data memory 66, via data cache 86. Although environment 60 shows only one processing core, every aspect of this disclosure is equally consistent with multi-core processors and environments.

Virtually any of the microprocessor substructures 68 through 86 may include logic paths that can potentially limit overall data throughput. In such paths, non-transparent, fast-bypass memory circuit 10 may be used to an advantage. For example, memory circuit 10 may be used in decoder logic 72, execute logic 80A/B, and/or writeback logic 82A/B.

Another use for memory circuit 10 in the various substructures of microprocessor 62 may be to reduce the effects of clock jitter and clock skew. Clock jitter refers to the inherent period-length variation of the pulse train from a clock; it may result from various environmental factors. Clock skew is a scenario in which different microprocessor substructures receive imperfectly synchronized clock pulses due to so-called within-die (WID) delay variations. Some WID delay variations can result from nonidealities in fabrication—geometric and/or material inconsistencies that affect signal-path impedances, for example. Other delay variations are merely the result of the clock pulse having to travel different distances to reach the various substructures of the microprocessor.

Figure 7:
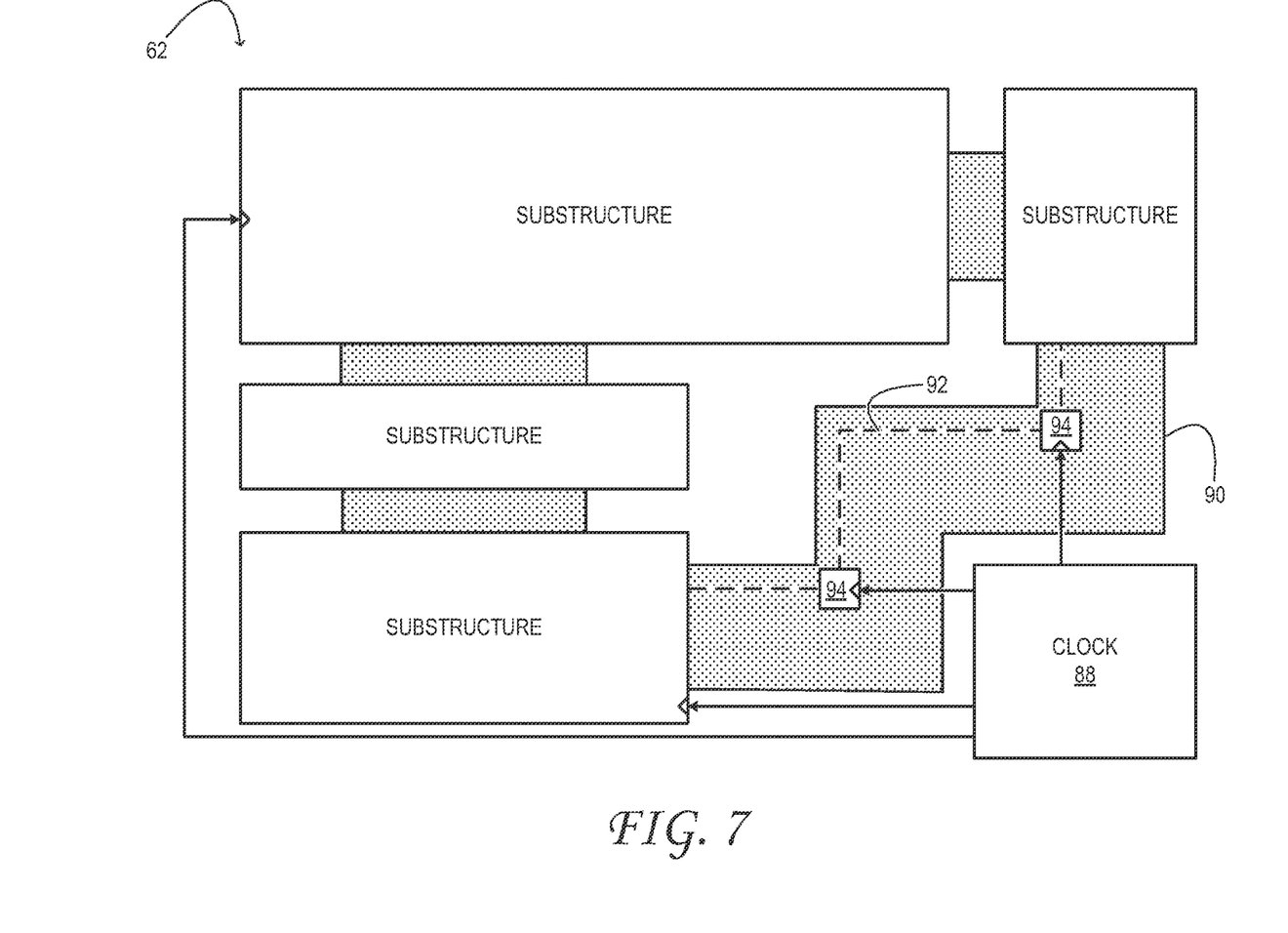
FIG. 7 is a highly schematic view of a microprocessor in accordance with an embodiment of this disclosure.

FIG. 7 illustrates this point. The drawing shows, as unshaded rectangular boxes, an example layout of substructures (any of substructures 68 through 86, for example) in a portion of microprocessor 62. The drawing also shows clock 88, which transmits a clock pulse to at least some of the substructures over signal paths of unequal length. Returning again to FIG. 1, the reader is reminded that flip-flop 16 of memory circuit 10 is triggered to store the level of the input data on receiving clock pulse 12, and that the clock pulse is received into this flip-flop through buffer 36. As noted hereinabove, the buffer may be configured to delay the clock pulse by an amount suitable to effect time borrowing in multi-cycle interconnect 90, in order to reduce the effects of clock skew and clock jitter in microprocessor 62. For instance, a jitter event may result in a clock edge arriving earlier than expected at the clock input of a given memory circuit. As a result, the data-setup time $t_S$ is effectively lengthened, leaving less time for the logic state at the data input to be set up. By delaying the arrival of the clock edge to SA stage 32 with buffer 36, it can be ensured that the data input has adequate time to set up, and that the memory circuit stores the correct level of the data input. Notably, with the configurations disclosed herein, this extra buffer delay will not increase $t_{DQ}$, since the output, prior to latching, propagates directly from first data input 20, not from the output of the flip-flop.

Memory circuit 10 may also be used in so-called repeater-type interconnects that carry data signals among the various substructures of microprocessor 62. This aspect is illustrated with further reference to FIG. 7. The interconnects are shown in this drawing as shaded regions.

Interconnect 90, in particular, is configured to carry data between two substructures of microprocessor 62. This interconnect includes a monodirectional signal path 92 through which a data signal is carried over a conductor or series of conductors. In some embodiments, an interconnect may include a bidirectional signal path—e.g., two antiparallel, monodirectional signal paths. In still other embodiments, an interconnect may include virtually any multiplicity of mono-directional or bidirectional signal paths—64 bidirectional signal paths, for example, for bidirectional exchange of 64-bit data between substructures of the microprocessor.

As illustrated in FIG. 7, signal path 92 may be shorter than some signal paths that carry data to the same substructure, and longer than others. The difference in the geometric lengths of the various signal paths could potentially result in asynchronous arrival of previously synchronized data into a substructure, as could WID delay variations that result from fabrication inconsistencies. To better synchronize the arrival of data into the various microprocessor substructures, interconnect 90 and other interconnects of microprocessor 62 may be repeater-based interconnects, in which every signal path includes at least one clocked memory stage 94, through which a data signal is actively driven. In some embodiments, some or all of the repeater-based interconnects may be multi-cycle repeater-based interconnects, in which every signal path includes two or more clocked memory stages arranged in series. In this configuration, a data signal toggles through each clocked memory stage in sequence, driven by the synchronized clock pulses received therein.

Figure 8:
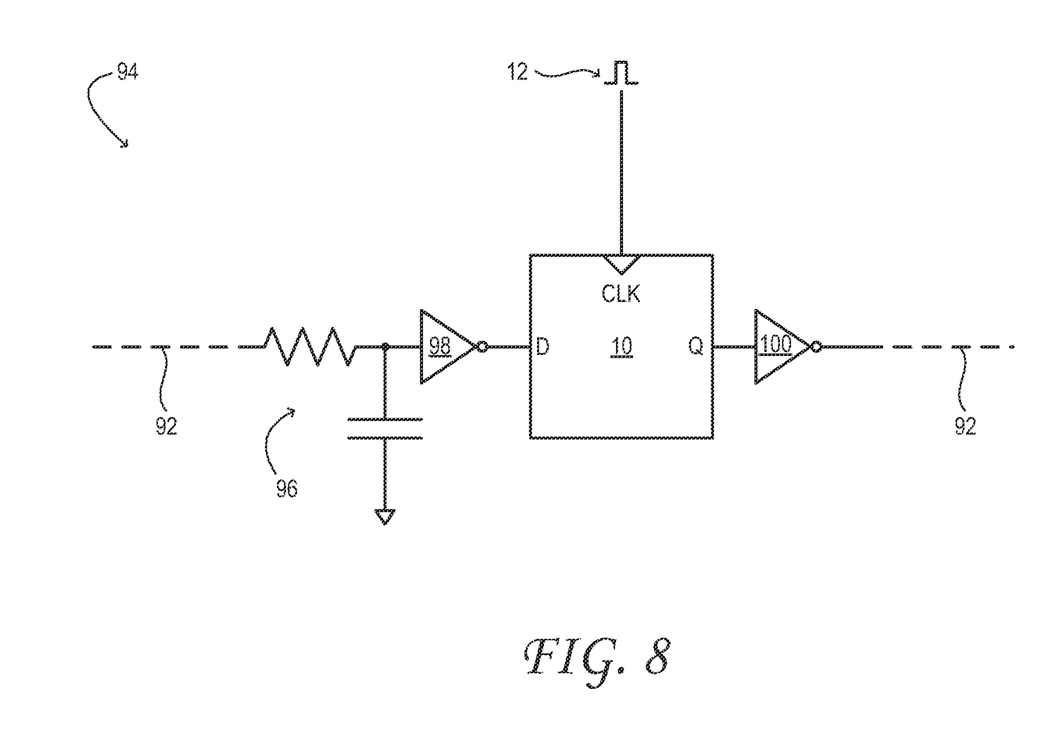
FIG. 8 schematically shows a clocked memory stage suitable for use in a repeater-based interconnect in accordance with an embodiment of this disclosure.

FIG. 8 schematically shows one example of a clocked memory stage 94 suitable for use in multi-cycle repeater-based interconnect 90. In this circuit, data is driven through signal path 92 from left to right in the drawing, first through low-pass filter stage 96 and then through inverting buffer 98. From inverting buffer 98, the data is applied in inverted form to the D input of memory circuit 10. The memory circuit also receives clock pulse 12. Promptly on receipt of the clock pulse, the data level received at the D input appears at output Q, as described hereinabove. Clocked memory stage 94 also includes inverting buffer 100 coupled to output Q. The signal from output Q is received in inverting buffer 100, which drives signal path 92 to the same data level as was received at input D, in synchronicity with clock pulse 12.

Referring again to FIG. 1 and to the discussion above, buffer 36 may be configured to delay the clock pulse by an amount suitable to effect time borrowing in multi-cycle interconnect 90, in order to average out within-die delay variations in the various segments of the interconnect.

It will be understood, finally, that the memory circuits described hereinabove are embodiments of this disclosure—non-limiting examples for which numerous variations and extensions are contemplated as well. Accordingly, this disclosure includes all novel and non-obvious combinations and sub-combinations of the such circuits, as well as any and all equivalents thereof.

The invention claimed is:

1. A memory circuit in which a level of a first data input appears promptly at an output in response to a clock pulse received, the circuit comprising:
    a flip-flop triggered by the clock pulse and configured to receive the first data input and drive a second data input;
    a first control input driven by the clock pulse;
    a second control input driven by the flip-flop;
    a third control input, where the second and third control inputs are maintained high prior to receipt of the clock pulse, and become complementary upon receipt of the clock pulse; and
    selection logic configured to receive the first and second data inputs and the first, second and third control inputs, the selection logic configured to drive the output of the memory circuit to the level of the first data input or the level of the second data input depending on the first, second and third control inputs, and where the output of the memory circuit is driven to the level of the first data input only when both the first and second control inputs are high.

2. The memory circuit of claim 1 where receipt of the clock pulse triggers the flip-flop to store the level of the first data input, and where the output of the memory circuit is driven to the level of the first data input before the level of the first data input is stored.

3. The memory circuit of claim 2 where the output of the memory circuit is driven to the level of the first data input on receipt of the clock pulse in the selection logic.

4. The memory circuit of claim 3 further comprising a buffer through which the clock pulse triggers the flip-flop, the buffer delaying the triggering of the flip-flop relative to receipt of the clock pulse in the selection logic.

5. The memory circuit of claim 2 where the flip-flop includes:
    upstream memory logic that receives the first data input and drives the second control input; and downstream memory logic that receives the second control input and drives the second data input.

6. The memory circuit of claim 5 where the upstream memory logic is a clocked, sense-amplifier-type latch.

7. The memory circuit of claim 5 where the downstream memory logic is an unclocked RS-type latch.

8. The memory circuit of claim 5 where the upstream memory logic drives the third control input also received in the selection logic.

9. The memory circuit of claim 1 where the output of the memory circuit is driven to the level of the first data input only when each of the first, second, and third control inputs are high.

10. The memory circuit of claim 1 where the selection logic is configured to drive the output of the memory circuit to the level of the second data input when the output is not driven to the level of the first data input.

11. The memory circuit of claim 1 where the selection logic includes an inverting complex gate configured to receive, in addition to the first data input, an output-promoter input and an output-demoter input, and to furnish the output of the memory circuit.

12. The memory circuit of claim 11 where the selection logic is configured such that the output-demoter input becomes high only when the second data input and at least one of the first, second, and third control inputs are low.

13. The memory circuit of claim 11 where the selection logic is configured such that the output-promoter input becomes high only when the second data input is low or each of the first, second, and third control inputs are high.

14. The memory circuit of claim 1 where the flip-flop is a D-type flip flop.

15. The memory circuit of claim 1 where the selection logic includes a multiplexer.

16. The memory circuit of claim 1 where the selection logic and the flip-flop are fabricated from complementary metal-oxide-semiconductor elements.

17. A method to make a level of a first data input appear promptly at an output of a memory circuit in response to a clock pulse received, the method comprising:
    driving a first control input with the clock pulse;
    triggering a flip-flop to store the level of the first data input on receipt of the clock pulse, the flip-flop configured to drive a second data input, a second control input and a third control input, where the second and third control inputs are maintained high prior to receipt of the clock pulse, and become complementary upon receipt of the clock pulse; and
    selection logic configured to receive the first and second data inputs and the first, second and third control inputs, driving the output of the memory circuit to the level of the first data input or of the second data input depending on the first, second and third control inputs, where the output is driven to the level of the first data input on receipt of the clock pulse in the selection logic, and before the level of the first data input is stored, and where the output is driven to the level of the first data input only when both the first and second control inputs are high.

18. The method of claim 17 where the output of the memory circuit is driven to the level of the second data input as soon as the level of the first data input is stored.

19. A memory circuit in which a level of a first data input appears promptly at an output in response to a clock pulse received, the circuit comprising:
- a flip-flop triggered by receipt of the clock pulse to store the level of the first data input and configured to drive a second data input;
- a first control input driven by the clock pulse;
- a second control input driven by the flip flop;
- a third control input, where the second and third control inputs are maintained high prior to receipt of the clock pulse, and become complementary upon receipt of the clock pulse;
- selection logic configured to drive the output of the memory circuit to the level of the first data input or of the second data input depending on the first, second and third control inputs, the output being driven to the level of the first data input on receipt of the clock pulse in the selection logic and before the level of the first data input is stored, and where the output is driven to the level of the first data input only when both the first and second control inputs are high; and
- a buffer through which the clock pulse triggers the flip-flop, the buffer delaying the triggering of the flip-flop relative to receipt of the clock pulse in the selection logic.

20. The memory circuit of claim 19 where the delay is suitable in duration to enable the memory circuit to absorb skew and jitter from the clock pulse.

\* \* \* \* \*